(12) United States Patent
Fujimori

(10) Patent No.: US 7,981,577 B2
(45) Date of Patent: Jul. 19, 2011

(54) PROCESS FOR PRODUCING DYE-CONTAINING NEGATIVE CURABLE COMPOSITION, COLOR FILTER, AND COLOR FILTER PRODUCTION PROCESS

(75) Inventor: Toru Fujimori, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 982 days.

(21) Appl. No.: 11/848,639

(22) Filed: Aug. 31, 2007

(65) Prior Publication Data

US 2008/0063953 A1    Mar. 13, 2008

(30) Foreign Application Priority Data

Aug. 31, 2006  (JP) .................................. 2006-235928

(51) Int. Cl.
*G02B 5/20* (2006.01)
(52) U.S. Cl. ........................ 430/7; 430/270.1; 430/281.1
(58) Field of Classification Search ........................ None
See application file for complete search history.

(56) References Cited

U.S. PATENT DOCUMENTS

2002/0034697 A1* 3/2002 Machiguchi et al. ............. 430/7
2003/0232259 A1* 12/2003 Araki ................................ 430/7

FOREIGN PATENT DOCUMENTS

| GB | 2003494 A | 3/1979 |
|----|-----------|--------|
| JP | 54-63903 A | 5/1979 |
| JP | 2-181704 A | 7/1990 |
| JP | 2-199403 A | 8/1990 |
| JP | 5-273411 A | 10/1993 |
| JP | 6-75375 A | 3/1994 |
| JP | 7-140654 A | 6/1995 |
| JP | 08-024775 A | 1/1996 |
| JP | 2002-099076 A | 4/2002 |
| JP | 2002-258473 A | 9/2002 |
| JP | 2002-278056 A | 9/2002 |
| JP | 2004-325864 A | 11/2004 |
| JP | 2006-010910 A | 1/2006 |

OTHER PUBLICATIONS

Notice of Reasons for Rejection, dated Sep. 21, 2010, issued in corresponding JP Application No. 2006-235928, 3 pages in English and Japanese.
Office Action dated Mar. 8, 2011 on Japanese Application No. 2006-235928.

* cited by examiner

*Primary Examiner* — John A. McPherson
(74) *Attorney, Agent, or Firm* — Sughrue Mion, PLLC

(57) ABSTRACT

According to an aspect of the invention, there is provided a process for producing a dye-containing negative curable composition, the process including passing a mixture containing a dye, a photopolymerization initiator, and a radical polymerizable monomer through a filter having a pore diameter of from not less than 0.02 μm to less than 0.2 μm.

21 Claims, No Drawings

PROCESS FOR PRODUCING DYE-CONTAINING NEGATIVE CURABLE COMPOSITION, COLOR FILTER, AND COLOR FILTER PRODUCTION PROCESS

CROSS-REFERENCE TO RELATED APPLICATION

This application claims priority under 35 USC 119 from Japanese Patent Application No. 2006-235928, the disclosure of which is incorporated by reference herein.

BACKGROUND OF THE INVENTION

1. Field of the Invention

This invention relates to a process for producing a dye-containing negative curable composition suitable for forming a colored image constituting a color filter to be used for a liquid crystal display device (LCD), a solid state image pickup device (CCD, CMOS, etc.) or the like, a color filter produced by using the dye-containing negative curable composition produced by the production process, and a production process for the color filter.

2. Description of the Related Art

As processes for producing a color filter used for liquid crystal display devices and solid state image pickup devices, a staining process, a printing process, an electrodeposition process and a pigment dispersion process are known.

In a pigment dispersion process, a color filter is produced by a photolithographic process using a colored radiation-sensitive composition prepared by dispersing a pigment in a photosensitive composition. Color filters produced by this process are stable with respect to light, heat and the like since pigments are used. A high positional accuracy can be obtained in this process since patterning is carried by a photolithographic process, and this process has been widely used as a process suitable for preparing a color filter for a large-screen and high-resolution color display.

In producing a color filter by a pigment dispersion process, a radiation-sensitive composition is first coated on a glass substrate with a spin coater or a roll coater and dried to form a coated film. Then, colored picture elements are formed by pattern exposure and development of the coated film. A color filter can be produced by performing this operation for each color.

It has been disclosed that a negative photosensitive composition in which a photopolymerizable monomer and a photopolymerization initiator are included together with an alkali soluble resin is used in the pigment dispersion process (e.g., see Japanese Patent Application Laid-Open (JP-A) Nos. 2-181704, 2-199403, 5-273411, 7-140654, and 54-63903).

Recently, in color filters for solid state image pickup devices, even higher resolution is desired. However, the conventional pigment dispersion processes have difficulties in further improving the resolution, and there are problems such as generation of color irregularities due to coarse particles of the pigment, and thus they are not suitable for a use which requires fine patterns such as solid state image pickup devices.

In view of the above-described problems, technologies for using dyes in place of pigments have heretofore been proposed (see JP-A No. 6-75375, for example). However, it is necessary to add a large amount of dye to a dye-containing curable composition to be used for manufacturing color filters for solid state image pickup devices due to the requirement of a film thickness of 1.0 μm or less, and coating uniformity of the dye-containing curable composition has been insufficient.

Since a colored pattern has become increasingly minute and a film thickness of the colored pattern has become increasingly thin to be used for solid state image pickup devices, contamination with minute foreign contaminants has become an issue, and establishment of a production process for achieving smoothness and uniform thickness has become remarkably important. However, now that the colored pattern has become further minute, it is difficult in the conventional technologies to obtain a dye-containing negative curable composition in which generation of and contamination with minute contaminates are suppressed, and which provides a good film thickness uniformity (in-plane uniformity) when a film is formed by coating the composition.

SUMMARY OF THE INVENTION

According to an aspect of the invention, there is provided a process for producing a dye-containing negative curable composition, comprising passing a mixture containing (A) a dye, (B) a photopolymerization initiator, and (C) a radical polymerizable monomer through a filter having a pore diameter of from not less than 0.02 μm to less than 0.2 μm.

DETAILED DESCRIPTION OF THE INVENTION

Hereinafter, a production process for a dye-containing negative curable composition of this invention, a color filter produced by using the dye-containing negative curable composition produced by the production process, and a production process for the color filter will be described in details.

<<Dye-Containing Negative Curable Composition Production Process>>

The dye-containing negative curable composition production process of this invention comprises allowing a mixture containing components ((A) to (C) and preferably components (D) to (G)) described later in this specification to pass through a filter having a pore diameter of from not less than 0.02 μm to less than 0.2 μm.

With such a constitution of the process, since it is possible to effectively suppress generation of minute contaminants, which is particularly problematic when forming a minute colored pattern such as a color filter for a solid state image pickup device, good film thickness uniformity (in-plane uniformity) is achieved when the film is obtained by coating the composition, thereby making it possible to achieve a sufficient development latitude. The constitution is particularly effective for coating on a large diameter wafer.

As the filter to be used, those that have been used for filtration of photoresist compositions may be used without particular limitation.

Examples of the filter include filters made from a fluorine resin such as PTFE (polytetrafluoroethylene), a polyolefin resin such as polyethylene and polypropylene (PP), and the like. Among the above, a polyethylene film or a polypropylene film is preferred. In general, examples of the polyethylene film include a high density polyethylene (HDPE) film and an ultrahigh molecular weight polyethylene (UPE) film, and HDPE and UPE are particularly preferred.

The pore diameter of the filter to be used in this invention is 0.02 μm or more but less then 0.2 μm. In the case where a filter having a pore diameter of 0.2 μm or more is used, a filtering effect is lowered. In the case where a filter having a pore diameter of less than 0.02 μm is used, a filtering property (filtering efficiency) is deteriorated. The pore diameter may preferably be from 0.02 to 0.15 μm, more preferably from 0.02 to 0.1 μm.

As the pore diameter, it is possible to apply nominal values of filter manufacturers.

As a commercially available filter, it is possible to select one having the above-specified pore diameter from those provided by Nihon Pall Ltd., Advantec Toyo Kaisha, Ltd., Nihon Entegris K.K. (former Nihon Mykrolis K.K), Kitz Microfilter Corporation, an the like.

Conditions under which the step of passing through the filter is performed are not particularly limited in this invention, buts in the case where a dye, a photopolymerization initiator, and a radical polymerizable, monomer are mixed optionally together with other components such as an organic solvent and a binder, and then allowed to pass through the filter, it is preferable that a pressure and a viscosity are adjusted to a range of 0.01 to 0.5 MPa and a range of 3 to 30 mP·s, respectively. It is possible to measure the viscosity using a rotational viscometer, an oscillating viscometer, and the like.

The step of passing through the filter may be performed once or plural times. In the case of performing the step plural times, a filter to be used may have an identical pore diameter or different pore diameter in each step.

<Mixture>

In the dye-containing negative curable composition production process of this invention, a mixture containing (A) a dye, (B) a photopolymerization initiator, and (C) a radical polymerization monomer is used.

The mixture is obtainable by mixing and dissolving the components. Conditions for the mixing and the dissolving are not particularly limited, but (C) a radical polymerizable monomer may preferably be dissolved in an organic solvent followed by mixing with other components.

Hereinafter, the components of the mixture to be used in this invention will be described.

(A) Dye

The mixture to be used in this invention contains at least one dye. It is possible to select the dye to be used from known dyes without particular limitation, and, for example, dyes that are soluble in organic solvents are suitably used.

Hereinafter, preferred examples of the organic solvent-soluble dyes will be described in detail.

As the organic solvent-soluble dye, those that have heretofore been used for color filters may be used without particular limitation.

Examples of the dye include dyes described in JP-A Nos. 64-90403, 64-91102, 1-94301, 611614, 5-333207, 6-35183, 6-51115 and 6-194828; Japanese Patent No. 2592207; and U.S. Pat. Nos. 4,808,501, 5,667,920 and 5,059,500.

As the dye, azo dyes such as pyrazole azo dye, anilinoazo dye, pyrazolotriazole azo dye and pyridone azo dye, triphenylmethane dye, anthraquinone dye, anthrapyridone dye, benzylidene dye, oxonol dye, cyanine dye, phenothiazine dye, pyrrolopyrazole azomethine dye, xanthene dye, phthalocyanine dye, benzopyran dye, indigo dye, and the like can be used. Dyes such as pyrazole azo dye, anilinoazo dye, pyrazolotriazole azo dye and pyridone azo dye, anthraquinone dye, and anthrapyridone dye are particularly preferred.

When the composition is formulated as a resist for developing with water or an alkali, acid dyes and/or derivatives thereof may be suitably used from the viewpoint of completely removing the binder and/or dye by development. Alternatively, it is preferable to use direct dyes, basic dyes, mordant dyes, acid mordant dyes, azoic dyes, disperse dyes, oil soluble dyes, food dyes, and/or derivatives thereof.

The acid dyes and derivatives thereof will be described below.

—Acid Dyes and Derivatives Thereof—

The acid dye is not particularly restricted, so long as it is a dye having acidic groups such as sulfonic acid, carboxylic acid and phenolic hydroxyl group. However, the acid dye should be selected considering all required characteristics such as solubility in the organic solvent and developer used for development, salt forming ability with basic compounds, light absorbance, interaction with other components in the curable composition, light fastness, and thermal resistance, and the like.

Specific examples of the acid dye are described below, but not limited thereto:

acid alizarin violet N;

acid black 1, 2, 24, 48;

acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;

acid chrome violet K;

acid Fuchsin;

acid green 1, 3, 5, 9, 16, 25, 27, 50, 58, 63, 65, 80, 104, 105, 106, 109;

acid orange 6, 7, 8, 10, 12, 26, 50, 51, 52, 56, 62, 63, 64, 74, 75, 94, 95, 107, 108, 169, 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;

acid violet 6B, 7, 9, 17, 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;

Direct Yellow 2, 33, 34, 35, 38, 39, 43, 47, 50, 54, 58, 68, 69, 70, 71, 86, 93, 94, 95, 98, 102, 108, 109, 129, 136, 138, 141;

Direct Orange 34, 39, 41, 46, 50, 52, 56, 57, 61, 64, 65, 68, 70, 96, 97, 106, 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;

Direct Violet 47, 52, 54, 59, 60, 65, 66, 79, 80, 81, 82, 84, 89, 90, 93, 95, 96, 103, 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;

Direct green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;

Mordant Violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3;

and derivatives of these dyes.

Along these, acid black 24; acid blue 23, 25, 29, 62, 80, 86, 87, 92, 138, 158, 182, 243, 324:1; acid orange 8, 51, 56, 63, 74; acid red 1, 4, 8, 34, 37, 42, 52, 57, 80, 97, 114, 143, 145, 151, 183, 217, 249; acid violet 7, acid yellow 17, 25, 29, 34, 42, 72, 76, 99, 111, 112, 114, 116, 134, 155, 169, 172, 184, 220, 228, 230, 232, 243; acid green 25; and derivatives thereof are preferred.

Azo, xanthene or phthalocyanine acid dyes other than those described above are also preferred. Acid dyes such as C.I. solvent blue 44 and 38, C. I. Solvent orange 45, rhodamine B, rhodamine 110, 3-[(5-chloro-2-phenoxyphenyl)hydrazono]-3,4-dihydro-4-oxo-5-[(phenylsulfonyl)amino]-2,7-Naphthalenedisulfonic acid, and derivatives of these dyes are also preferably used.

Examples of the derivatives of the acid dye include inorganic salts of the acid dye having acidic groups such as sulfonic acid and carboxylic acid, salts of the acid dyes with nitrogen containing compounds, and sulfonamides of the acid dye, and the like. The derivative is not particularly restricted so long as it is soluble in a solution of the dye-containing negative curable composition prepared. However, the derivatives of the acid dye should be selected considering of all required characteristics such as solubility in the organic solvent and developer used for development, light absorbance, interaction with other components in the curable composition, light fastness, and thermal resistance, and the like.

The salt of the acid dye with the nitrogen-containing compound will be described below. Forming a salt between the acid dye and nitrogen-containing compound may be effective for improving solubility (solubility in organic solvents) of the acid dye, the resistance and light-fastness.

The nitrogen containing compound that forms a salt with the acid dye, and the nitrogen containing compound that forms an amide bond with the acid dye are selected considering all the characteristics such as solubility of the salt or amide compound in the organic solvent or the developer, salt forming ability, light absorbance and color value of the dye, interaction with other components in the curable composition, and thermal resistance and light-fastness as a coloring agent. The molecular weight of the nitrogen-containing compound is preferably as small as possible when the compound is selected considering only the light absorbance and color value. The molecular weight is preferably 300 or less, more preferably 280 or less, and particularly preferably 250 or less.

The molar ratio of nitrogen-containing compound/acid dye (hereinafter, abbreviated as n) in "the salt of an acid dye and a nitrogen-containing compound" will be described. The reference character n is a value determining the molar ratio of the acid dye molecule and the nitrogen-containing compound (an amine compound) forming a counter ion with the acid dye molecule, and may be selected in accordance with the acid dye-amine compound salt formation condition. Specifically, a numerical value n in a range of $0<n\leq5$ may be employed in many cases and is selected in consideration of all of the needed properties; the solubility in an organic solvent and a developer, the salt formability, the absorbance, interaction with another component in the curable composition, light-fastness, and thermal resistance. In the case of selection in consideration of only the absorbance, the above-mentioned numerical value n is preferably selected in a range of $0<n\leq4.5$; more preferably selected in a range of $0<n\leq4$; and particularly preferably selected in a range of $0<n\leq3.5$.

Since the above-mentioned acid dye becomes acidic by introducing an acidic group into the structure, the dye can be made contrarily a non-acidic dye by changing the substituent group. The acid dye sometimes advantageously works at the time of alkaline development, however in some cases it causes over-development and therefore, a non-acidic dye is preferably used in some cases. Examples of the non-acidic dye to be used include the above-exemplified acid dyes having no acidic group.

With respect to Me above-mentioned dyes, monochromatic dyes may be used in the case where the dyes compose yellow, magenta, and cyan, which are additive complementary colors, and two or more kinds of dyes may be used in combination in the case where the dyes compose red, green, and blue, which are additive primary colors. In the invention, additive mixture systems (mixtures) of at least two kinds of dyes having different absorption properties in combination are preferably used to form color hue of the color system.

Although differing in accordance with the type, the content of the dye in the mixture is preferably in a range of 0.5 to 80% by mass and more preferably in a range of 10 to 60% by mass, based on the total mass of the mixture (excluding organic solvents). In the case where two or more kinds of dyes are mixed to adjust the color, the content of the dye whose addition amount is the minimum is preferably 10% or more in 100% total dye amount.

(B) Photopolymerization Initiator

The mixture used in the invention contains at least one kind of photopolymerization initiator. The photopolymerization initiator can polymerize and cure a polymerizable monomer to be hereinafter described, in case of constituting the dye-containing negative curable composition of the invention.

The photopolymerization initiator is not restricted particularly so long as it can polymerize the polymerizable monomer. The photopolymerization initiator is preferably selected with a view point of the characteristic, initiation efficiency, absorption wavelength, availability, cost, and the like.

Examples of the photopolymerization initiator include at least one of an active halogen compound selected from halomethyl oxadiazole compounds and halomethyl-s-triazine compounds, 3-aryl substituted coumarin compound, a rofin dimmer, a benzophenone compound, an acetophenone compound and derivatives thereof, cyclopentadiene-benzene-iron complexe and salt thereof, and an oxime compound, and the like.

Examples of the halomethyl oxadiazol compound, which is an active halogen compound, include 2-halomethyl-5-vinyl-1,3,4-oxadiazole compound and the like, described in JP-B No. 57-6096, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, and the like.

Further, Examples of the halomethyl-s-triazine compounds, which is an active halogen compound, include a vinyl halomethyl-s-triazine compound described in JP-B No. 59-1281, 2-(naphthol-1-yl)-4,6-bis-halomethyl-s-thiazine compound, and 4-(p-aminophenyl)-2,6-di-halomethyl-s-thiazine compound, described in JP-A No. 53-133428.

Specific examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphthol-1-yl)-4,6-bistrichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-(chloroethyl)aminophenyl]-2,6-di(trichloroethyl)-s-triazine, 4-(p-N-chloroethylaminophenly)-2,6-di(trichloromethyl)-s-triazine, 4-(p-N-ethoxycarbonylmethylaminophenol)-2,6-di(trichloromethyl)-s-triazine, 4-[p-N,N-di(phenyl)aminophenyl]-2,6-di(trichloromethyl)-s-triazine, chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

In addition, TAZ-107, TAZ-110, TAZ-104, TAZ-109, TAZ-140, TAZ-204, TAZ-113, and TAZ-123, as TAZ series manufactured by Midori Kagaku Co., Ltd., T-OMS, T-BMP, T-R, and T-B, as T-series manufactured by Panchim Co., Ltd, Irgacure 651, Irgacure 184, Irgacure 500, Irgacure 1000, Irgacure 149, Irgacure 819, Irgacure 261, as the Irgacure series, Darocure 1173 as the Darocure series, manufactured by Ciba Speciality Chemicals Co., 4,4'-bis(diethylamino)-benzophenone, 2-benzyl-2-dimethylamino-4-morpholinobutyrophenone, 2,2-dimethoxy-2-phenylacetophenone, 2-(o-chlorophenyl)-4,5-diphenyl imidazolyl dimer, 2-(o-fluorophenyl)-4,5-diphenyl imidazolyl dimer, 2-(o-methoxyphenyl)-4,5-diphenyl imidazolyl dimer, 2-(p-methoxyphenyl)-4,5-diphenyl imidazolyl dimer, 2-(p-dimethoxyphenyl)-4,5-diphenyl imidazolyl dimer, 2-(2,4-dimethoxyphenyl)-4,5-diphenyl imidazolyl dimer, 2-(p-methylmercaptophenyl)-4,5-diphenyl imidazolyl dimer, and benzoin isopropyl ether can also be used usefully.

As the above-mentioned oxime compounds, oxime compounds described in JP-A No. 2000-80068, WO-02/100903A1, and JP-A No. 2001-233842 have been known. Specific examples include 2-(O-benzoyloxime)-1-[4-(phenylthio)phenyl]-1,2-butanedione, 2-(O-benzoyloxime)-1-[4-phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-(2-butylbenzoyl)-9H-carbazol-3-yl]ethanone. However, the oxime compounds are not limited to these examples.

These photo polymerization initiators may be used alone or two or more of them may be used while being mixed.

Among them, from the viewpoint of the sensitivity, at least one kind of the photo polymerization initiators is preferably the One photo polymerization initiator or the oxime photo polymerization initiator, and most preferably the oxime photo polymerization initiator.

From the above-mentioned viewpoint, 2-(O-benzoyloxime)-1-[4-(phenylthio)phenyl]-1,2-octanedione (preferably manufactured by Ciba Specialty Chemicals Inc.), 1-(O-acetyloxime)-1-[9-ethyl-6-(2-methylbenzoyl)-9H-carbazol-3-yl]ethanone (preferably manufactured by Ciba Specialty Chemicals Inc.), and combination thereof are particularly preferable.

Sensitizers and light stabilizers may be used together with these photopolymerization initiators. Specific examples of them include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acrydone, 10-butyl- 2-chloroacrydone, benzyl, dibenzylacetone, p-(dimethylamino)phenylstyrylketone, p-(dimethylamino)phanyl-p-methylstyrylketone, benzophenone, p-(dimethylamino) benzophenone (or Michler's ketone), p-(diethylamino) benzophenone, benzoanthrone, and benzothiazole compounds described in JP-B No. 51-48516, Tinuvin 1130 and Tinuvin 400.

Known photopolymerization initiators other than those described above may be used in the mixture in the invention. Examples of them include vicinal polyketolaldonyl compounds described in U.S. Pat. No. 2,367,660, α-carbonyl compounds described in U.S. Pat. Nos. 2,367,661 and 2,367,670, acyloin ether compounds described in U.S. Pat. No. 2,448,828, aromatic acyloin compounds substituted with α-hydrocarbons described in U.S. Pat. No. 2,722,512, polynuclear quinone compounds described in U.S. Pat. Nos. 3,046,127 and 2,951,758, combinations of trially imidazole dimer and p-aminophenyl ketone described in U.S. Pat. No. 3,549,367, and benzothiazole compounds/trihalomethyl-s-triazine compounds described in JP-B No. 51-48516.

The total content of the photo polymerization initiator (and conventionally known initiator) in the mixture used in the invention is preferably in a range of 0.01 to 50% by mass, more preferably in a range of 1 to 30% by mass, and particularly preferably in a range of 1 to 20% by mass, based on the total mass of the radical polymerizable monomer which will be described later. If the content is in the above-mentioned range, polymerization curing can be carried out favorably to avoid that the film strength becomes weak due to low molecular weight in spite of high polymerization degree.

(C) Radical Polymerizable Monomer

The mixture to be used in this invention contains at least one radical polymerizable monomer.

As the radical polymerizable monomer, a compound having a boiling point of 100° C. or more under an ordinary pressure and at least one ethylenic double bond capable of addition polymerization is suitably used, and the compound may preferably be (meth)acrylate. The radical polymerizable monomer is capable of achieving the negativity of the dye-containing negative curable composition when contained in the mixture to be used in this invention together with a photopolymerization initiator and the like described later in this specification.

Examples of the compounds having a boiling point of 100° C. or higher under normal pressure and at least one (meth) acryloyl group (an addition polymerizable ethylenic double bond) include monofunctional acrylates and methacrylates such as polyethylene glycol mono(meth)acrylate, polypropylene glycol mono(meth)acrylate, phenoxyethyl(meth)acrylate; polyfunctional acrylates and methacrylates such as polyethylene glycol di(meth)acrylate, trimethylolethane tri(meth) acrylate, neopentyl glycol di(meth)acrylate, pentaerythritol tri(meth)acrylate, pentaerythritol tetra(meth)acrylate, dipentaeythritol penta(meth)acrylate, dipentaerythritol hexa(meth) acrylate, hexanediol(meth)acrylate, trimethylolpropane tri(acryloyloxypropyl)ether, tri(acryloyloxyethyl)isocyanurate, compounds obtained by adding ethylene oxide or propylene oxide to polyfunctional alcohols such as a glycerin, a trimethylolethane, etc., and then carrying out (meth)acrylation of the obtained compounds, urethane acrylates described in JP-B Nos. 48-41708, 50-6034, and JP-A No. 51-37193, polyester acrylates described in JP-A No. 48-64183 and JP-B Nos. 49-43191 and 52-30490, and epoxyacrylates which are reaction products of epoxy resins and (meth)acrylic acid, and their mixtures. Further, examples may include photo-curable monomers and oligomers described in Journal of Adhesion Society of Japan, vol. 20, No. 7, pp. 300-308.

As the radical polymerizable monomer in this invention, an acidic group-containing polyfunctional (meth)acrylic compound (sometimes referred to as "acidic group-containing radical polymerizable monomer" this invention) having a melting point of 100° C. or more under an ordinary pressure is also suitably used.

The acidic group may preferably be a carboxyl group, a slufo group, a phosphate group, and the like, more preferably the carboxyl group and the slufo group, particularly preferably the carboxyl group.

The acidic group-containing radical polymerizable monomer may have any structure without particular limitation, but a compound having three or more ethylenic double bonds capable of addition polymerization may preferably be used as the acidic group-containing radical polymerizable monomer. Examples of the preferred compound include a compound to which the acidic group (preferably the carboxyl group or the sulfo group, in which the carboxyl group is particularly preferred) is introduced by reacting a hydroxyl group of a hydroxyl group-containing 5-functional acrylic compound and the like (such as dipentaerythritol pentaacrylate wherein an OH group is substituted by a carboxyl group containing substitution group (such as a carboxyethyl group) and the like).

Among the above, TO-756, TO-1382, TO-2359, and TO-2360 manufactured by Toagosei Co., Ltd. are suitably used as the preferred acidic group-containing radical polymerizable monomer.

Among the above-described radical polymerizable monomers, polyethyleneglycol di(meth)acrylate, trimethylolethane tri(meth)acrylate, neopentylglycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexanediol(meth)acrylate, TO-1382, TO-2359, TO-2360, and the like are preferred.

A total content of the radical polymerizable monomer in the mixture to be used in this invention may preferably be 1 to 60 mass %, more preferably 10 to 50 mass %, based on a total mass of the mixture (excluding organic solvents). When the total content is within the above-specified range, it is possible to ensure good curability with good elution property of non-exposed portion.

(D) Binder Resin

The mixture to be used in the invention may contain at least one kind of binder resin, if necessary. The binder resin may be properly selected from conventionally known resin components, and organic high molecular weight polymers can be used preferably. Among them, an alkali-soluble binder is preferable and the alkali-soluble binder is not particularly limited as long as it is water-soluble or alkali-soluble and is preferably selected from the viewpoint of the thermal resistance, developability, and availability.

The alkali-soluble binder is preferably a linear organic polymer which is soluble in organic solvents and is able to be developed with an aqueous weak alkali solution. Examples of such liner organic polymers include polymers; having carboxylic acids as the side chains. Examples of the polymers having carboxylic acids as the side chains include methacrylic acid copolymers, acrylic acid copolymers, itaconic acid copolymers, crotonic acid copolymers, maleic acid copolymers and partially esterified maleic acid copolymers as described in JP-A Nos. 59-44615, 59-53836 and 59-71048, and Japanese Patent Application Publication (JP-B) Nos. 54-34327, 58-12577 and 54-25957. In particular, acidic cellulose derivatives having carboxylic acids as the side chains are preferable as the alkali-soluble binder.

Examples of other preferable alkali-soluble binders include adducts of acid anhydrides to polymers having hydroxyl groups, polyhydroxystyrene resins, polysiloxane resins, poly(2-hydroxyethyl(meth)acrylate), polyvinyl pyrrolidone, polyethylene oxide and polyvinyl alcohol.

A monomer having a hydrophilic group may be copolymerized. Examples of such a monomer include alkoxyalkyl (meth)acrylate, hydroxyalkyl(meth)acrylate, glycerol(meth) acrylate, (meth)acrylamide, N-methylol acrylamide, secondary or tertiary alkyl acrylamide, dialkylaminoalkyl (meth)acrylate, morpholine(meth)acrylate, N-vinyl pyrrolidone, N-vinyl caprolactam, vinyl imidazole, vinyl triazole, methyl (meth)acrylate, ethyl(meth)acrylate, branched or linear propyl(meth)acrylate, branched or linear butyl(meth) acrylate, phenoxyhydroxypropyl(meth)acrylate, and the like.

Other preferable monomers having a hydrophilic group include those containing tetrahydrofurfuryl group, phosphoric acid, phosphate ester, quaternary ammonium salt, ethyleneoxy chain, propyleneoxy chain, sulfonic acid group and salts thereof, and morpholinoethyl groups.

With a viewpoint of improving the cross-linking efficiency, the binder resin may have a polymerizable group as the side chain, and polymers containing an allyl group, a (meth) acrylic group, an aryloxy alkyl group, etc. as the side chain are also preferably used.

Examples of the polymers having polymerizable groups include KS resist-106 (manufactured by Osaka Organic chemical Industry Ltd.), and Cyclomer P series (manufactured by Daicel Chemical Industries, Ltd.). Further, for improving the strength of the cured film, an alcohol soluble nylon and a polyether of 2,2-bis(4-hydroxyphenyl)-propane and epichlorohydrin are also useful.

Among the alkali-soluble binders, polyhydroxystyrene resins, polysiloxane resins, acrylic resins, acrylamide resins and acrylic/acrylamide copolymer resins are preferred from the viewpoint of thermal resistance, and acrylic resins, acrylamide resins and acrylic/acrylamide copolymer resins are preferred from the viewpoint of development controlling ability.

Examples of the acrylic resin include copolymers constituted by the monomers selected firm benzyl(meth)acrylate, (meth)acrylic acid, hydroxyethyl(meth)acrylate and (meth) acrylamide, and KS resist-106 (manufactured by Osaka Organic Chemical Industry Ltd.), Cyclomer P series (manufactured by Daicel Chemical Industries, Ltd.).

The alkali-soluble binder is preferably a polymer having a weight-average molecular weight of 1000 to $2\times10^5$, more preferably a polymer having a weight-average molecular weight of 2000 to $1\times10^5$, and particularly a polymer having a weight-average molecular weight of 5000 to $5\times10^4$ (measured by GPC method, polystyrene conversion value).

The binder resin is not necessarily an indispensable component in the invention, however it is sometimes added in order to improve the film surface property. The content of the binder is preferably 1 to 40% by mass, more preferably 1 to 30% by mass, based on the solid content in the mixture used in the invention.

If the binder resin is added in the above-mentioned range, the binder resin can effectively improve the evenness of the coating film surface, and also is effective to suppress elution of the exposed part. If the amount of the binder resin is too large, the effect of suppressing the elution of the exposed part may be considerably deteriorated in some cases.

(E) Fluorine-Containing and/or Silicon-Containing Surfactant

The mixture to be used in this invention may contain at least one fluorine-containing and/or silicon-containing surfactant as required.

In this invention, the fluorine-containing and/or silicon-containing surfactant means a surfactant containing a fluorine atom (fluorine-containing surfactant), a surfactant containing a silicon atom (silicon-containing surfactant), or a surfactant containing a fluorine atom and a silicon atom (fluorine-containing and silicon-containing surfactant). The fluorine-containing and/or silicon-containing surfactant may be used alone or in combination of two or more.

Examples of the fluorine-containing and/or silicon-containing surfactant include those disclosed in JP-A Nos. 62-36663, 61-226746, 61-226745, 62-170950, 63-34540, 7-230165, 8-62834, 9-54432, 9-5988, and 2002-277862, U.S. Pat. Nos. 5,405,720, 5,360,692, 5,529,881, 5,296,330, 5,436,093, 5,576,143, 5,294,551, and 5,824,451.

Alternatively, each of commercially available surfactants described below may be used as it is as the fluorine-containing and/or silicon-containing surfactant.

Examples of the commercially available surfactants include fluorine-containing surfactants and silicon-containing surfactants such as Eftop-EF301 and -EF303 (manufactured by Shin Akita Kasei), Florado-FC430 and -FC431 (manufactured by 3M), Megafack-F171, -F173, -F176, -F189, and -R08 (manufactured by Dainippon Ink and Chemicals, Incorporated), Surflon S-382, Surflon SC-101, -102, -103, -104, -105, and -106 (manufactured by Asahi Glass Co., Ltd.), Troysol S-366 (manufactured by Troy Chemical Company), and the like. Also, KP-341 which is a polysiloxane polymer (manufactured by Shin-Etsu Chemical Co., Ltd.) may also be used as the silicon-containing surfactant.

Also, other than the above-described surfactants, a surfactant using a polymer having a fluoroaliphatic group derived from a fluoroaliphatic compound prepared by telomerization (sometimes called a telomer method) or oligomerization (sometimes called an oligomer method) may be suitably used as the fluorine-containing and/or silicon-containing surfactant.

It is possible to synthesize the fluoroaliphatic compound by the method disclosed in JP-A No. 2002-90991.

As the polymer having a fluoroaliphatic group, a copolymer of a monomer having a fluoroaliphatic group and (poly (oxyalkylene))acrylate and/or poly(oxyalkylene))metacrylate that may be distributed irregularly or block copolymerized may preferably be used. Examples of the poly (oxyalkylene) group include a poly(oxyethylene) group, a poly(oxypropylene) group, a poly(oxybutylene) group, and the like, and a unit having alkylenes having different chain lengths in one chain length, such as poly(oxyethylene-oxypropylene-oxyethylene block linkage) group and a poly (oxyethylene-oxypropylene block linkage) group. Further, the copolymer of the monomer having a fluoroaliphatic group and (poly(oxyalkylene))acrylate (or methacrylate) is not limited to binary copolymers, and a tertiary copolymer obtained by simultaneously copolymerizing a monomer having different two or more fluoroaliphatic groups, different two or more (poly(oxyalkylene))acrylates (or methacrylates), and the like may be used.

Examples of commercially available surfactants include Megafack-F178, -F470, -F473, -F475, -F476, and -F472 (manufactured by Dainippon Ink and Chemicals, Incorporated). Other examples of the surfactants include a copolymer of acrylate (or methacrylate) having a $C_5F_{13}$ group and (poly (oxyalkylene))acrylate (or methacrylate); a copolymer of acrylate (or methacrylate) having a $C_6F_{13}$ group, (poly(oxyethylene))acrylate (or methacrylate), and (poly(oxypropylene))acrylate (or methacrylate); a copolymer of acrylate (or methacrylate) having a $C_8F_{17}$ group and (poly(oxyalkylene))acrylate (or methacrylate); a copolymer of acrylate (or methacrylate) having a $C_8F_{17}$ group, (poly(oxyethylene))acrylate (or methacrylate), and (poly(oxypropylene))acrylate (or methacrylate); and the like.

A total content of the fluorine-containing and/or silicon-containing surfactant may preferably be 0.001 to 2 mass %, more preferably 0.001 to 1 mass % based on the total mass (excluding organic solvent) of the mixture.

(F) Organic Solvent

In the preparation of the mixture to be used in the invention, at least one organic solvent may be used. The solvent is not particularly restricted so long as solubility of each component and coating properties of the dye-containing negative curable composition prepared from the mixture is satisfied. The organic solvent is preferably selected considering solubility of the dye and the binder, coating properties and safety.

Examples of the preferable organic solvent include esters such as ethyl acetate, n-butyl acetate, isobutyl acetate, amyl formate, isoamyl acetate, butyl propionate, isopropyl butylate, ethyl butylate, butyl butylate, alkyl esters, methyl lactate, ethyl lactate, methyl oxylactate, ethyl oxylactate, butyl oxylactate, methyl methoxyacetate, ethyl methoxyacetate, methoxyacetate, methyl ethoxyacetate, ethyl ethoxyacetate;

3-oxypropionic acid alkyl esters such as methyl 3-oxypropionate and ethyl 3-oxypropionate, such as methyl 3-methoxypropionate, ethyl 3-methoxypropionate, methyl 3-methoxypropionate and ethyl 3-ethoxypropionate; 2-oxypropionic acid alkyl esters such as methyl 2-oxypropionate, ethyl 2-oxypropionate and propyl 2-oxypropionate, such as methyl 2-methoxypropyonate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanate and ethyl 2-oxobutanate;

ethers such as diethyleneglycol dimethylether, tetrahydrofuran, ethyleneglycol monomethylether, ethyleneglycol monoethylether, methyl cellosolve acetate, ethyl cellosolve acetate, diethyleneglycol monomethylether, diethyleneglycol monoethylether, diethyleneglycol monobutylether, propyleneglycol monomethyl ether, propyleneglycol monomethylether acetate, propyleneglycol monoethylether acetate, and propyleneglycol monopropylether acetate;

ketones such as methylethyl ketone, cyclohexanone, 2-heptanone and 3-heptanone; and aromatic hydrocarbons such as toluene and xylene.

(G) Other Components

—Heat Polymerization Inhibitor—

In the mixture to be used in the invention, a heat polymerization inhibitor is preferably added in addition to the components above, and preferable examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole, and the like.

—Cross-Linking Agent—

In the invention, a cross-linking agent may be used supplementarily to obtain a film cured to a higher extent. In this case, at least one kind of the following cross-linking agents may be added.

The cross-linking agent available in the invention is not particularly restricted, so long as it is able to cure the layer by cross-lining reaction. Examples of the cross-linking agent include (a) epoxy resins, (b) melamine compounds, guanamine compounds, glycoluryl compounds or urea compounds substituted with at least one substituent selected from a methylol group, an alkoxymethyl group and an acyloxymethyl group, and (c) phenol compounds, naphthol compounds or hydroxyanthrathene compounds substituted with at least one substituent selected from a methylol group, an alkoxymethyl group and an acyloxymethyl group. A multifunctional epoxy resins are particularly preferable.

—Other Additives—

Various additives such as fillers, polymer compounds other than those above, adherence enhancing agents, antioxidants, ultraviolet-absorbents and antiflocculants may be added, if necessary, to the mixture to be used in the invention.

Specific examples of the additives include fillers such as glass and alumina; polymer compounds other than the binder resins such as polyvinyl alcohol, polyacrylic acid, polyethyleneglycol monoalkylether and polyfluoroalkyl acrylate; adherence enhancing agents such as vinyl trimethoxy silane, vinyl triethoxy silane, vinyl tris(2-methoxyethoxy)silane, N-(2-aminoethyl)-3-aminopropylmethyldimetoxy silane, N-(2-aminoethyl)-3-aminopropyltrimethoxy silane, 3-aminopropyltriethoxy silane, 3-glycidoxypropyl trimethoxy silane, 3-glycidoxypropyl methyldimethoxy silane, 2-(3,4-epoxycyclohexyl)ethyl trimethoxy silane, 3-chloropropylmethyl dimethoxy silane, 3-chloropropyl trimethoxy silane, 3-methacryloxypropyl trimethoxy silane, and 3-mercaptopropyl trimethoxy silane; antioxidants such as 2,2-thiobis(4-methyl-6-t-butylphenol) and 2,6-di-t-butylphenol; ultraviolet-absorbents such as 2-(3-t-butyl-5-methyl-2-hydroxydiphenyl)-5-chlorobenzothiazole and alkoxybenzophenone; and antiflocculants such as sodium polyacrylate.

Organic carboxylic acids, preferably low molecular weight organic carboxylic acids with a molecular weight of 1000 or less may be added for enhancing the alkali solubility and the development ability of the dye-containing negative curable composition prepared from the mixture.

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimetylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acid such as benzoic acid, toluic acid, cuminic acid, hemelitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydroatropic acid, hydrocinnamic acid, mandelic acid, phenylsuccinic acid, atropic acid, cinnamic acid, methyl cinnamate, benzyl cinnamate, cinnamilydenic acetic acid, cumalic acid and umbelic acid.

Among the component (D), specific examples can include those having a carboxyl group.

Exposure of the dye-containing negative curable composition prepared by the process of the invention may be carried out using any method such as a proximity method, a mirror projection method, a stepper method, and exposure is preferably carried out by a stepper method (a reduction-projection exposure method using a reduction-projection exposure apparatus). This stepper method is a method for forming patterns by carrying out exposure while altering the exposure amount step by step and is capable of making the rectangular geometry of the patterns better at the time of executing stepper exposure. The exposure apparatus to be used for the stepper exposure may be, for example, an i-line stepper (trade name: FPA-3000i5+, manufactured by Canon Inc.).

The dye-containing negative curable composition prepared by the process of the invention may be suitably used for formation of color filters (formation of colored picture elements) used for liquid crystal displays (LCD) and solid state image pickup devices (for example CCD and CMOS), and for preparing printing inks, ink-jet inks, paints, and the like.

<<Color Filter and Color Filter Production Process>>

Hereinafter, the color filter of this invention will be described in terms of a production process therefor.

In the color filter production process of this invention, the dye-containing negative curable composition produced by the production process of this invention described above is used. Since the dye-containing negative curable composition produced by the production process of this invention effectively suppresses generation of contaminants and achieves good film thickness uniformity (in-plane uniformity), it is possible to obtain a color filter having high light transmittance and high resolution by using the composition for the color filter production.

The color filter production process of this invention includes coating the dye-containing negative curable composition produced by the production process of this invention on a support, and then exposing through a mask and developing to form a pattern. More specifically, the composition is coated on the support by spin coating, flow casting coating, roll coating, or the like to form a radiation sensitive composition layer, and the layer is subjected to exposure via a predetermined mask pattern, followed by development with a developer, to form a negative colored pattern, whereby the color filter is advantageously prepared (image forming step). A curing step of curing the thus-formed colored pattern by heating and/or exposure may be further included in the production process.

A color filter having desired number of hues may be prepared by repeating the image forming step (and curing step, if necessary) in accordance with the number of the hues. Preferable light or radiation used for the purpose above is particularly a ultraviolet light such as g-ray, h-ray, or i-ray.

Examples of the support include a soda glass, Pyrex (R) glass and quartz glass, which are used for a liquid crystal displays, those on which a transparent conductive film is adhered, and the substrate of photoelectric conversion device used for the imaging element such as, for example, a silicone substrate and complementary metal oxide film semiconductor (CMOS). Black stripes for isolating each picture element may be formed on these substrates.

An undercoat layer may be provided on the substrate for improving adhesive property to the upper layers, for preventing diffusion of substances, and for planarizing the surface of the substrate.

Any developers may be used so long as they comprise a composition that is able to dissolve non-cured portions of the dye-containing negative curable composition produced by the process of the invention while the cured portions are left undissolved. Specifically, a combination of various organic solvents or an aqueous alkali solution may be used. The above-described organic solvents which may be used for preparing the dye-containing negative curable composition of the invention may be also used for the developer.

As the aqueous alkali solution, an aqueous alkali solution in which an alkali compound is dissolved in the concentration of 0.001 to 10% by mass (preferably 0.01 to 1% by mass) is preferred. Examples of the compound include sodium hydroxide, potassium hydroxide, sodium carbonate, sodium silicate, sodium metasilicate, ammonia water, ethylamine, diethylamine, dimethylethanolamine, tetraethylammonium hydroxide, tetraethylammonium hydroxide, choline, pyrrole, piperidine, and 1,8-diazabicyclo-[5.4.0]-7-undecene. When a developer prepared from such an aqueous alkali solution is used, washing is carried out with water after the development.

The color filter of the invention can be used for a liquid crystal display (LCD) device and a solid state image pickup device such as a CCD. The color filter is particularly suitable for a high resolution CCD element or CMOS having 4,000,000 picture elements or more. The color filter of the invention may be used as a color filter that is disposed between the light-receiving part and the micro-lenses for focusing light in each picture element constituting the CCD or CMOS.

EXAMPLES

Hereinafter, this invention will be more specifically described by way of examples, but this invention is not limited to the following examples. Also, unless otherwise mentioned, "parts(s)" is on a mass basis.

Examples 1 to 10, Comparative Examples 1 to 3

1) Production of Dye-Containing Negative Curable Composition

Components shown in Table 1 were mixed and dissolved to prepare mixtures 1 to 6. The fluorine-containing and/or silicon-containing surfactant was added in an amount of 300 ppm based on a total mass (excluding the organic solvent) of each of the mixtures.

TABLE 1

| | (D) Binder resin (alkali-soluble binder) | (C) Radical polymerizable monomer | (A) Dye | (B) Photo-polymerization initiator | (E) Fluorine-containing and/or silicon-containing surfactant | (F) Organic solvent |
|---|---|---|---|---|---|---|
| Mixture 1 | — | Monomer A (0.64 g) | Valifast Yellow 1101 (0.8 g) | Oxime A (0.25 g) | W-1 | Ethyl lactate (8 g) |
| Mixture 2 | — | Monomer C (0.51 g) | Valifast Yellow 1101 (0.26 g) Acid Red 57 (0.54 g) | Oxime B (0.31 g) | W-3 | Cyclohexanone (8 g) |

TABLE 1-continued

| | (D) Binder resin (alkali-soluble binder) | (C) Radical polymerizable monomer | (A) Dye | (B) Photo-polymerization initiator | (E) Fluorine-containing and/or silicon-containing surfactant | (F) Organic solvent |
|---|---|---|---|---|---|---|
| Mixture 3 | — | Monomer A (0.51 g) | Valifast Blue 2620 (0.8 g) | TAZ-107 (0.25 g) | W-4 | Cyclohexanone (8 g) |
| Mixture 4 | — | Monomer B (0.34 g) | Valifast Blue 2620 (0.4 g) Acid Violet 7 (0.3 g) | Oxime B (0.28 g) | W-5 | Cyclohexanone (8 g) |
| Mixture 5 | Resin A (0.2 g) | Monomer B (0.4 g) | Valifast Blue 2620 (0.8 g) | Oxime A (0.25 g) | W-6 | Cyclohexanone (8 g) |
| Mixture 6 | — | Monomer A (0.64 g) | Valifast Blue 2620 (0.8 g) | Oxime A (0.25 g) | W-2 | Cyclohexanone (8 g) |

Details of the components (A) to (E) in Table 1 are as follows.

Resin A: benzylmethacrylate/methacrylic acid copolymer (=80/20) [molar ratio])

Monomer A: TO-756 [carboxyl group-containing 3-functional acrylate] manufactured by Toagosei Co., Ltd.

Monomer B: TO-1382 [carboxyl group-containing 5-functional acrylate] manufactured by Toagosei Co., Ltd.

Monomer C: KAYARAD DPHA manufactured by Nippon Kayaku Co., Ltd.

TAZ-107: manufactured by Midori Kagaku Co., Ltd.

Oxime A: 2-(O-benzoyloxime)-1-[4-(phenylthio)phenyl]-1,2-octanedione manufactured by Ciba Specialty Chemicals Oxime B: 1-(O-acetyloxime)-1-[9-ethyl-6-(2-methylbenzoyl)-9H-carbazole-3-yl]ethanone manufactured by Ciba Specialty Chemicals W-1: Megafack F176 (manufactured by Dainippon Ink and Chemicals, Incorporated) (fluorine-containing surfactant)

W-2: Megafack R08 (manufactured by Dainippon Ink and Chemicals, Incorporated) (fluorine-containing and silicon-containing surfactant)

W-3: polysiloxane polymer KP-341 (manufactured Shin-Etsu Chemical Co., Ltd.) (silicon-containing surfactant)

W-4: Megafack F475 (manufactured by Dainippon Ink and Chemicals, Incorporated) (fluorine-containing surfactant)

W-5: copolymer of acrylate having a $C_6F_{13}$ group, (poly(oxypropylene))acrylate, and (poly(oxypropylene))methacrylate W-6: copolymer of acrylate having a $C_6F_{13}$ group and (poly(ethyleneoxy-propyleneoxy-ethyleneoxy block))acrylate Dye-containing negative curable compositions of Examples 1 to 10 and Comparative Examples 1 to 3 were obtained by filtering the mixtures 1 to 6 obtained above using filters shown in Table 2.

—Filtration Conditions—

A flat membrane filter of 47 mm was set on a filtration device to perform filtration under a nitrogen pressure of 0.2 MPa.

2) Preparation of Silicon Wafer Substrate with Undercoat Layer

A solution of a resist CT-2000L (manufactured by FUJIFILM Electronics Materials Co., Ltd.) was coated on a silicon wafer substrate using a spin coater to achieve a film thickness of 2 μm and the silicon wafer substrate was dried by heating at 220° C. for one hour to form a cured film (undercoat layer).

3) Exposure and Development of Dye-Containing Negative Curable Composition (Patterned Image Formation)

Each of the dye-containing negative curable compositions obtained in 1) was coated on the undercoat layer of the silicon wafer substrate obtained in 2) to achieve a film thickness of 1 μm using a spin coater, followed by pre-baking at 100° C. for 120 seconds.

Next, the coating film was subjected to irradiation using an i-ray reduced projection exposure apparatus and under the conditions of a wavelength of 365 nm and through a mask having a line width of 2 μm. After the irradiation using a 100%-developer of CD-2000 (manufactured by FUJIFILM Electronics Materials Co., Ltd.), development was performed under the conditions of 23° C. for 60 seconds. Subsequently, each of the silicon wafers was rinsed with flowing water for 20 seconds and then subjected to spin drying to obtain a patterned image (color filter). The form of the patterned image was confirmed in an usual method through optical microscopic observation and SEM photographic observation.

4) Evaluation (1) Number of Minute Contaminants

Each of the dye-containing negative curable compositions obtained in Examples and Comparative Examples was coated on an 8-inch wafer, and a surface of the coated film was observed with an optical microscope to count the number of minute contaminants per predetermined area by the visual observation. The observation with optical microscope was conducted under the conditions of ×1000 (transmitting measurement) and ×50 (reflection measurement).

(2) In-Plane Uniformity of Coating Film

Each of the dye-containing negative curable compositions obtained in 1) was coated on an 8-inch wafer to form a film having a thickness of 1.0 μm using a spin coater, followed by pre-baking at 100° C. for 120 seconds. After that, thicknesses at 12 points whose positions were decided at random on a surface of the film were measured to calculate the maximum difference between the average of the thicknesses at the 12 points and each of the thicknesses at the 12 points. The smaller the difference is, the better the uniformity is. Also, though it is possible to perform the film thickness measurement using a contact type film thickness meter or a non-contact type film thickness meter, a contact type profilometer (DEKTAK6 manufactured by Vecco Instruments) was used for measuring a distance between the wafer and the film surface after scraping off the film from the wafer.

—Film Thickness Measurement Conditions—

Load: 10 mg
Measurement Speed: M-Range

Results obtained from the above are shown in Table 2.

TABLE 2

|  | Mixture | Filter type and pore diameter | Number of minute contaminants | Coating film thickness uniformity (Δμm) |
|---|---|---|---|---|
| Example 1 | Mixture 1 | UPE 0.1 μm | 5 | 0.04 |
| Example 2 | Mixture 2 | UPE 0.1 μm | 3 | 0.04 |
| Example 3 | Mixture 3 | UPE 0.05 μm | 2 | 0.02 |
| Example 4 | Mixture 4 | UPE 0.02 μm | 1 | 0.01 |
| Example 5 | Mixture 5 | UPE 0.1 μm | 6 | 0.03 |
| Example 6 | Mixture 1 | PTFE 0.1 μm | 8 | 0.04 |
| Example 7 | Mixture 2 | PTFE 0.04 μm | 6 | 0.02 |
| Example 8 | Mixture 3 | PP 0.1 μm | 8 | 0.03 |
| Example 9 | Mixture 4 | PP 0.05 μm | 4 | 0.02 |
| Example 10 | Mixture 6 | PP 0.05 μm | 5 | 0.03 |
| Comparative Example 1 | Mixture 1 | No filtration | 106 | 0.15 |
| Comparative Example 2 | Mixture 2 | UPE 0.5 μm | 48 | 0.10 |
| Comparative Example 3 | Mixture 2 | UPE 0.2 μm | 23 | 0.08 |

<<Description of Symbols in Table 2>>
UPE: Ultrahigh molecular weight polyethylene filter [manufactured by Nihon Entegris K.K. (formerly Nihon Mykrolis K.K.)]
PTFE: Polytetrafluoroethylene filter [manufactured by Nihon Pall Ltd.]
PP: Polypropylene filter [manufactured by Kitz Microfilter Corporation]

As shown in Table 2, in the case of using the dye-containing negative curable compositions (Examples 1 to 10) produced by the production process of this invention, generation of minute contaminants was suppressed and coating film in-plane uniformity was excellent.

In contrast in the case of using the dye-containing negative curable composition of Comparative Example 1 that was not passed through a filter in the production process and in the case of using the dye-containing negative curable compositions of Comparative Examples 2 and 3 passed through filters having a pore diameter of 0.2 μm or more, many minute contaminants were observed and coating film in-plane uniformity was inferior.

The present invention provides at least the following embodiments 1 to 15.

1. A process for producing a dye-containing negative curable composition, comprising passing a mixture containing (A) a dye, (B) a photopolymerization initiator, and (C) a radical polymerizable monomer through a filter having a pore diameter of from not less than 0.02 μm to less than 0.2 μm.

2. The process according to embodiment 1, wherein the mixture further contains (D) a binder resin.

3. The process according to embodiment 1, wherein the mixture further contains (E) a fluorine-containing and/or silicon-containing surfactant.

4. The process according to embodiment 1, wherein (A) the dye comprises a mixture of at least two dyes that are different in an absorption property from each other.

5. The process according to embodiment 1, wherein a dye-containing negative curable composition to be used for manufacturing a color filter for a solid state image pickup device is produced.

6. A color filter produced using the dye-containing negative curable composition produced by the process defined in embodiment 1.

7. A color filter produced using the dye-containing negative curable composition produced by the process defined in embodiment 2.

8. A color filter produced using the dye-containing negative curable composition produced by the process defined in embodiment 3.

9. A color filter produced using the dye-containing negative curable composition produced by the process defined in embodiment 4.

10. A color filter produced using the dye-containing negative curable composition produced by the process defined in embodiment 5.

11. A process for producing a color filter, comprising coating the dye-containing negative curable composition produced by the process defined in embodiment 1 on a support, and then exposing through a mask and developing to form a pattern.

12. A process for producing a color filter, comprising coating the dye-containing negative curable composition produced by the process defined in embodiment 2 on a support, and then exposing through a mask and developing to form a pattern.

13. A process for producing a color filter, comprising coating the dye-containing negative curable composition produced by the process defined in embodiment 3 on a support, and then exposing through a mask and developing to form a pattern.

14. A process for producing a color filter, comprising coating the dye-containing negative curable composition produced by the process defined in embodiment 4 on a support, and then exposing through a mask and developing to form a pattern.

15. A process for producing a color filter, comprising coating the dye-containing negative curable composition produced by the process defined in embodiment 5 on a support, and then exposing through a mask and developing to form a pattern.

According to this invention, it is possible to provide a process for producing a dye-containing negative curable composition in which occurrence of contamination with minute contaminants is suppressed, and which provides a good film thickness uniformity (in-plane uniformity) when a film is formed by coating the composition as well as to provide a color filter having high light transmittance and high resolution (particularly a color filter for solid state image pickup devices) and a production process for the color filter.

What is claimed is:

1. A process for producing a dye-containing negative curable composition, comprising passing a mixture containing (A) a dye, (B) a photopolymerization initiator, and (C) a radical polymerizable monomer through a filter comprising an ultrahigh molecular weight polyethylene or a polypropylene and having a pore diameter of from not less than 0.02 μm to less than 0.2 μm.

2. The process according to claim 1, wherein the mixture further contains (D) a binder resin.

3. A color filter produced using the dye-containing negative curable composition produced by the process defined in claim 2.

4. A process for producing a color filter, comprising coating the dye-containing negative curable composition produced by the process defined in claim 2 on a support, and then exposing through a mask and developing to form a pattern.

5. The process according to claim 1, wherein the mixture further contains (E) a fluorine-containing and/or silicon-containing surfactant.

6. A color filter produced using the dye-containing negative curable composition produced by the process defined in claim 5.

7. A process for producing a color filter, comprising coating the dye-containing negative curable composition produced by the process defined in claim 5 on a support, and then exposing through a mask and developing to form a pattern.

8. The process according to claim 1, wherein the dye (A) comprises a mixture of at least two dyes that are different in an absorption property from each other.

9. A color filter produced using the dye-containing negative curable composition produced by the process defined in claim 8.

10. A process for producing a color filter, comprising coating the dye-containing negative curable composition produced by the process defined in claim 8 on a support, and then exposing through a mask and developing to form a pattern.

11. The process according to claim 1, wherein a dye-containing negative curable composition to be used for manufacturing a color filter for a solid state image pickup device is produced.

12. A color filter produced using the dye-containing negative curable composition produced by the process defined in claim 11.

13. A process for producing a color filter, comprising coating the dye-containing negative curable composition produced by the process defined in claim 11 on a support, and then exposing through a mask and developing to form a pattern.

14. A color filter produced using the dye-containing negative curable composition produced by the process defined in claim 1.

15. A process for producing a color filter, comprising coating the dye-containing negative curable composition produced by the process defined in claim 1 on a support, and then exposing through a mask and developing to form a pattern.

16. The process according to claim 1, wherein the content of the dye (A) in the mixture is in the range of from 47 to 60% by mass based on the total mass of the mixture excluding organic solvents.

17. The process according to claim 1 wherein the photopolymerization initiator (B) includes an oxime compound.

18. The process according to claim 1, wherein the mixture further contains a solvent including cyclohexanone.

19. The process according to claim 1, wherein the radical polymerizable monomer (C) includes a compound having an acidic group and three or more ethylenic double bonds capable of addition polymerization.

20. The process according to claim 1, wherein the radical polymerizable monomer (C) includes a compound having an acidic group and three or more ethylenic double bonds capable of addition polymerization, wherein the acidic group is introduced by reacting a hydroxyl group of a hydroxyl group-containing 5-functional acrylic compound.

21. The process according to claim 1, wherein the radical polymerizable monomer (C) includes a compound obtained by substituting an OH group of dipentaerythritol pentaacrylate with a carboxyl group-containing substituent group.

* * * * *